United States Patent Office 3,367,875

Patented Feb. 6, 1968

3,367,875
COMPOSITION FOR ETCHING COPPER AND COPPER-CONTAINING ALLOYS

Abraham Isidor Sherer, Clifton, and Robert Milton McClanahan, Allendale, N.J., assignors to Philip A. Hunt Chemical Corporation, Palisades Park, N.J., a corporation of Delaware No Drawing. Filed Aug. 19, 1964, Ser. No. 390,747
7 Claims. (Cl. 252—79.4)

This invention relates to a new and improved composition and method for etching copper and alloys of copper, for example, brass.

More particularly, our invention pertains to a composition which is particularly suited for use in the powderless etching of a copper or copper alloy surface of a plate or other body, as in preparing an etched relief or printing plate or other etched body, and to a method of powderless etching which includes the use of such a composition.

It is conventional in preparing a printing surface by photoengraving on copper or brass to coat the surface with a photosensitive resist composition which is soluble in certain solvents or solvent solutions. Thereafter, the coating is exposed to an image-modulated light. The exposed portions become insoluble in the solvents or solvent solutions and act as a protective resist adhering to the metal substratum. This resist is substantially impervious to attack by the etchant in an etching bath. The conventional etching bath for copper and copper alloys is a ferric chloride solution. The modulated light image may constitute either a positive or a negative of the image to be printed, depending upon whether the etched plate is to be used for relief or intaglio printing.

The actual etching step is performed by subjecting the metal plate with the resist image thereon to an etching solution so as to etch the unexposed portions of the plate and leave the resist covered areas standing out in relief. The etching step can be carried out by splashing or throwing the etching solution against the plate so that it impinges thereon, the splashing or throwing usually being so controlled that the direction of movement of the etching solution is approximately perpendicular to the metal plate. Alternatively, the solution may be sprayed, as in the form of jets, against the metal plate.

The ferric chloride solution attacks the metal plate in the bare unexposed areas and removes the metal surface and the underlying metal by chemical action. Obviously, the areas of metal protected by the resist are not directly attacked. Nevertheless, as the etching solution removes the bare surface areas of the metal, the side walls of the ensuing depressions are not protected against lateral attack so that, as the etching proceeds, such side walls likewise are chemically attacked by the etching solution. This attack undercuts the walls of the resist protected metal surface areas and weakens the same, rendering them susceptible to chipping or even to actual breakage. Furthermore, the etching solution laterally attacks the resist protected areas directly beneath the resist. Thus, this sidewise etching, i.e., lateral attack, reduces the physical sizes of the resist covered areas. Hence, it alters the size or configuration of the material which eventually will be printed.

The term "etch factor" is commonly employed to indicate the degree of lateral atack on a photoengravel metal plate which takes place in an etching bath. The etch factor is the ratio between (a) the depth of an etch from the original surface of the plate down to the deepest part of the etch therein, and (b) the average loss in width of metal on the side of the image facing the etch which loss is measured at the top of the metal plate beneath the resist covered etch. In other words, the etch factor equals etch depth divided by lateral loss at the surface of the plate.

Desirably, the etch factor is a large number, e.g., 30 or more. With no protection whatsoever an etch factor up to 3 can be obtained in certain etching machines. Any factor greater than this indicates some degree of protection.

For many years it has been the practice to reduce lateral attack and thereby increase etch factor by a method known as "powder etching." Pursuant to this method, after a ferric chloride etching solution had dissolved some metal from the surface of the copper or copper alloy metal plate by chemical action, but before a significant amount of the metal had been dissolved by lateral attack, the metal plate was removed from contact with the etching solution and was rinsed off. The rinsed plate was dried and it was then treated with an etchant-unaffected powder to provide a measure of protection from lateral attack by the ferric chloride solution when the plate was once again subjected to etching. Such protection was achieved by powdering and burning-in the plate in each of several directions, for example, four directions, to wit, north, south, east and west, with an etchant resisting powder material known as an "etching powder." The method of application was such as to apply the powder to the side walls but not the bases of the etched areas. Typical etching powders are "dragon's blood" which is a natural resin, or a synthetic thermoplastic resin or a mixture of wax and a resin. After the lightly etched metal plate had been carefully powdered in each direction, the plate was heated to fuse and thereby fix, i.e., burn in, the etchant resisting material in place to the side walls of the etched areas as an etchant resisting coating in that direction. Thereupon, the lightly etched metal plate with the side walls of the lightly etched areas selectively protected by the burned-in etchant resisting coating was again subjected to the chemical action of the ferric chloride solution which attacked the bottom but not the side walls of the previously etched areas. After the second etching step had been carried out to reduce the etched areas to a somewhat greater depth, the previous process of rinsing, powdering and burning-in was repeated to protect the freshly exposed portions of the side walls. The alternate steps of etching and protecting were effected several times until a desired depth of etch was achieved. It was customary to use as few as three or as many as eight successive partial etching, powdering and burning-in steps to obtain a desired depth. Obviously, the powder etching process was slow, time consuming and expensive and required highly skilled help.

It has been proposed to eliminate powder etching of copper and copper alloy objects by the use of additives in a ferric chloride etching solution. Such additives purported to provide a protective film for the side walls of the etched areas as the etching progressed. An early patent which disclosed this idea was Jones, No. 2,746,848, issued May 22, 1956, in which the addition of thiourea to a ferric chloride etching bath for copper or brass was suggested. Subsequently, it has been proposed to add derivatives of thiourea and also to include film modifying agents for ferric chloride etching baths containing thiourea and derivatives thereof. These powderless etching baths have been single-phase baths in that they contained only a single solvent, to wit, water. Single-phase baths, although an improvement over powder etching, have been subject to many drawbacks. Thus, in single-phase baths for the powderless etching of copper and copper alloy metal plates it has been found necessary to use two separate and different baths for line and half-tone work. It was observed that the bath that was used for half-tones would undercut line work after a depth of approximately 0.007 inch and that the bath used for line work would undercut and severely reduce half-tones before a proper printing depth could be obtained for the latter. As the art is aware, in half-tone work, a good printing depth is in the neighborhood of 0.003 inch for a fine screen of about 130 lines; and a good printing depth for a coarser screen of say 65 lines is about 0.006 inch. A good printing depth for line work is about 0.018 to 0.022 inch.

Another difficulty experienced with previous powderless compositions and methods for the ferric chloride etching of copper and copper alloy metal plates was that if the bath was permitted to stand, its effectiveness would alter and it was necessary to repeatedly test out the bath and readjust it before it could be reused.

It is an object of our invention to provide a powderless composition and method for ferric chloride etching of a copper or copper alloy metal plate or object which composition and method permit etching of both half-tone and line work or combinations of half-tone and line work in the same bath and in a single step without any damage or undercutting to either the line or tone work, and to any desired depth in the line work that would be used in normal printing or other practices.

It is another object of our invention to provide a composition and method of the character described which will permit a bath to be reused after standing idle for a day and even up to three days (over a weekend) without the need for adjustment of the bath or alteration of etching procedures and which nevertheless will etch plates with results just as good as were obtained before the period of idleness.

It is another object of our invention to provide a composition and method of the character described which do not require the eaching bath to be aged before use and which, accordingly, can be used immediately after the components of the bath have been intermixed.

It is another object of our invention to provide a composition and method of the character described in which only one measurement of volume is necessary rather than the several weighings that presently are required with current powderless ferric chloride etching compositions, thereby eliminating the possibility of plural measurement errors.

It is another object of our invention to provide a composition and method of the character described which will form line and tone work that conform to the high industry standards for this class of work and in which no noticeable undercutting, i.e., lateral etch, is present in line and tone work.

It is another object of our invention to provide a composition and method of the character described in which tiny enclosed areas, such for example, as the bowls of fine lettering and reverse printing, are etched as deeply as required, and cleanly, with no signs of blocking or of loss of detail depth.

It is another object of our invention to provide a composition and method of the character described in which a good shoulder angle is obtained so as to increase the strength of the unetched metal surface areas without, however, having either too shallow an etch or too great a slope of the shoulder angle.

It is another object of our invention to provide a composition and method of the character described which will secure good results with various types of etching apparatuses.

Other objects of our invention in part will be obvious and in part will be pointed out hereinafter.

Our invention accordingly consists in the compositions of matter and series of steps which will hereinafter be described and of which the scope of application will be indicated in the appended claims.

Essentially, we carry out our invention by providing an etching bath which constitutes a two-phase dispersion as distinguished from the single phase of powderless etching baths for copper and copper alloy objects which heretofore have been employed. Our two-phase dispersion includes a water phase in which the ferric chloride is dissolved and a water-immiscible liquid in which ferric chloride is insoluble. In the use of the bath the water-immiscible liquid adheres to the metal object to be etched so as to form an etchant resistant, i.e., protective, film thereon which film is predominantly composed of the water-immiscible liquid. Quite apparently, if the protective film remained intact on the metal surfaces to be etched, no etching would take place. However, the protective film of our invention is characterized by its inability to strongly resist hydraulically applied mechanical shearing forces directed normal to the original metal surface of the object to be etched. Hence, when the etching solution strikes the protective film in a direction which is controlled to be substantially perpendicular to the original surface of the object the solution will disintegrate that portion of the film which is parallel to the original surface and will allow the film to remain intact on the side walls of an etched area. Thus, the etching will proceed almost perpendicularly, the angle of the side walls depending upon the strength of the film and its adherence to the metal substratum.

A simple two-phase dispersion of a water-immiscible liquid and an aqueous ferric chloride solution will not in practice achieve the objects of our invention for reasons which are not presently fully understood, but which are believed to be due to the adhesion between the water-immiscible liquid and the metal surface and to the strength of the film of the water-immiscible liquid which clings to the metal surface. Accordingly, persuant to our invention, we further include in the etching bath one or more additional components which are believed to affect the bond between the water-immiscible liquid and the metal surface, and to affect the cohesion between the molecules of a film of the water-immiscible liquid. These additional components and the water-immiscible liquid are chosen to produce a protective film that will adhere to the metal surface, but which forms a relatively weak bond therewith so that the film will be unable to strongly resist the aforesaid hydraulically generated normally applied shearing forces that come into play when the liquid etching batch is directed roughly perpendicularly against the metal surface.

The water-immiscible constituent of our etching bath is an organic liquid which, as indicated, is immiscible with water and which is non-reactive with an aqueous ferric chloride solution. Desirably, the water-immiscible organic liquid is a hydrocrabon liquid, and preferably is a petroleum fraction. Very good results are obtained where the petroleum fraction is principally of an aromatic nature, the aromatic portion constituting from 80 to 100% of the water-immiscible organic liquid. Typical examples of the organic liquids that we prefer to employ are toluene, gasoline, coal oil and xylene. It is desirable that the petroleum fraction have a high flash point, not so much as it affects the operability of the two-phase dispersion as it affects the safety of an etching path containing this material. Preferably, the petroleum fraction has a high boiling point in the range, for instance, of 90° to 390° C. We have determined that a high boiling point enhances the stability of the bath by minimizing evaporation. Furthermore, a boiling point within the indicated range ensures that the petroleum fraction will be quite fluid and not viscous.

The desired stability of the film is achieved by the presence in the etching bath of additional components which affect the wetting of the metal surface by the water-immiscible organic liquids, the bond between such liquid and the metal surface, and the strength of a film of such liquid. We have found that the additional components of the etching bath bring about the required degree of stability of the film which is such that the film is strong enough to resist the hydraulically generated shearing action when the film is at a substantial angle to a perpendicular to the direction in which liquid from the etching bath is directed against the metal object, and the film is weak enough not to resist such shearing action when the film is substantially perpendicular to such direction of motion of the etching liquid.

Best results with etch factors in excess of thirty and as large as one hundred have been obtained where six different types of additional components are included in the two-phase dispersion. We have found that when all the components are included the optimum results are secured. It is contemplated, however, that one or more, but never all, of the additional components may be omitted and the remaining components or components rebalanced to yield etch factors of ten or more. The additional components are: an ester of orthophosphoric acid and ethoxylated aliphatic alcohols or ethoxylated alkyl phenols, an alkyl quaternary fatty amine, a polyethoxylated amine, a substance selected from the group consisting of fatty amines and fatty amine oxides, an alkyl sulfate ester, and a glycol ether.

The additive composition includes from 80 to 95% by weight of the water-immiscible liquid and from 5 to 20% by weight of the additional components.

The etching bath embodying our invention includes a dominant proportion, to wit, over 80%, of a ferric chloride water solution, and a minor proportion of an additive composition which additive composition is a mixture of a water-immiscible liquid and one or more of the additional components just mentioned. The ferric chloride solution and the additive composition are stirred together to form the etching bath.

The ester of orthophosphoric acid and a compound selected from the group consisting of ethoxylated aliphatic alcohols and ethoxylated alkyl phenols is a member of the series of phosphated ethoxylated aliphatic alcohols and alkyl phenols, being a mixture of mono- and di-phosphate esters, having the formula

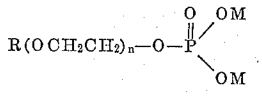

for the mono-phosphate ester, and the formula

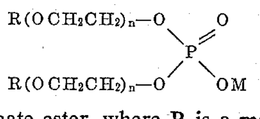

for the di-phosphate ester, where R is a member selected from the group consisting of alkyl phenol residues and aliphatic alcohol residues in which the non-aromatic portions thereof have from 8 to 24 carbon atoms, preferably are saturated and are branched and unbranched, M is H, *Na*, K or $NH_3$, and *n* is an integer from 1 to 20.

We may employ either the mono- or di-phosphate ester or mixtures thereof in any proportions.

These esters when used provide good results if present in amounts ranging from 15 to 50 parts by weight in the additive composition, with best results being secured where from 34 to 38 parts by weight thereof are utilized. The ethoxylation should be between 40 and 90% and preferaby is between 60 and 70%. Typical examples of phenols which are employed are nonyl phenols and dinonyl phenols. Typical alcohols that may be employed are dodecyl alcohol and tridecyl alcohol. In the preferred form of our invention, R is a residue of tridecyl alcohol.

Specific examples of phosphorylated ethoxylated esters are a mixture of the free acid forms of mono- and di-phosphate esters of ethoxylated tridecyl alcohol, commercially available from General Aniline as Gafac RS 610 which has a 60 to 70% ethoxylation, a mixture of the free acid forms of mono- and di-phosphate esters of ethoxylated nonyl phenol which has a 60 to 70% ethoxylation, sold as Gafac RE 610, and a mixture of the free acid forms of mono- and di-phosphate esters of ethoxylated dinonyl phenol which has a 60 to 70% ethoxylation, commercially available from Wayland Chemical Company as Alkapent M 60.

Other satisfactory materials are mixtures of the free acid forms, and sodium, potassium and ammonium salts of mono- and di-phosphate esters of ethoxylated nonyl phenol, ethoxylated dinonyl phenol, and ethoxylated dodecyl alcohol.

Other satisfactory commercial compounds are Alkapent DP 60 and Alkapent TD 100.

The alkyl quaternary fatty amine has the formula

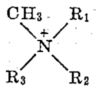

where $R_1$ is a member selected from the group consisting of long chain fatty acid residues and hydrogenated derivatives thereof having from 8 to 18 carbon atoms in the carbon chain, which preferably are unbranched, and which usually are a mixture of saturated and unsaturated chains as is common in naturally occurring products, $R_2$ is a member selected from the group consisting of $CH_3$, furfuryl and long chain fatty acid residues and hydrogenated derivatives thereof having from 8 to 18 carbon atoms in the carbon chain, which preferably are unbranched, and which usually are a mixture of saturated and unsaturated chains as is common in naturally occurring products, and $R_3$ is a member selected from the group consisting of $CH_3$ and long chain fatty acid residues and hydrogenated derivatives thereof having from 8 to 18 carbon atoms in the carbon chain, which preferably are unbranched, and which usually are a mixture of saturated and unsaturated chains as is common in naturally occurring products.

The alkyl quaternary fatty amine when used provides good results if present in amounts ranging from 5 to 25 parts by weight in the additive composition, with best results being secured where from 10 to 12 parts by weight thereof are utilized.

A specific example of an alkyl quaternary fatty amine is dimethyl alkyl furfuryl quaternary amine, commercially available from Archer, Daniels, Midland Company as Adogen 446.

Other satisfactory materials are dimethyl dihydrogenated tallow quaternary amine, dimethyl dicoco quaternary amine, dimethyl disoya quaternary amine, dimethyl distearyl quaternary amine, trimethyl soya quaternary amine, trimethyl coco quaternary amine, trimethyl palmityl quaternary amine, trimethyl stearyl quaternary amine, trimethyl tallow quaternary amine, and trimethyl hydrogenated tallow quaternary amine.

The polyethoxylated amine is a polyethoxylated mono- or di-amine having the formula

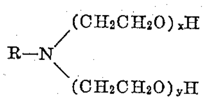

for the polyethoxylated monoamine, where $x+y$ is an integer ranging from 2 to 50 and where R is a long chain fatty acid residue having from 8 to 18 carbon atoms in the carbon chain, which preferably are unbranched, and which usually are a mixture of saturated and unsaturated chains as is common in naturally occurring products, and the formula

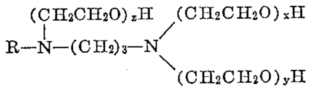

for the polyethoxylated diamine, where $x+y+z$ is an integer ranging from 3 to 80 and preferably is from 3 to 15, R being the same as defined for the polyethoxylated monoamine.

The polyethoxylated amine is cationic in acid media, e.g., in the ferric chloride aqueous solution.

The polyethoxylated amine when used provides good results in amounts ranging from 5 to 15 parts by weight in the additive composition, with best results being secured where from 8 to 12 parts by weight thereof are utilized.

Specific examples of polyethoxylated amines are the ethylene oxide condensation products of N-tallow trimethylene diamine, commercially available from Armour Industrial Chemical Co. as Ethoduomeen T 25 which is a diamine wherein $x+y+z$ is 15, Ethoduomeen T 20 a diamine wherein $x+y+z$ is 10, and Ethoduomeen T 13 a diamine wherein $x+y+z$ is 3.

Other satisfactory materials are stearyl polyethoxylated amines having $x+y$ from 2 to 50, soya bean polyethoxylated amines having $x+y$ from 2 to 15, oleyl polyethoxylated amines having $x+y$ from 2 to 5, coco polyethoxylated amines having $x+y$ from 2 to 15, and tallow polyethoxylated amines having $x+y$ from 2 to 15, all commercially available from Armour Industrial Chemical Company under the name of Ethomeens.

The fatty amine is a compound selected from the group consisting of primary fatty amines, secondary fatty amines and tertiary fatty amines, the amines being both saturated and unsaturated, primary fatty amines being preferred. The fatty amine has the formula

where $R_1$ is a member selected from the group consisting of an unbranched fatty acid residue containing from 8 to 18 carbon atoms in the carbon chain and hydrogenated derivatives thereof and butyric acid, and $R_2$ is a member selected from the group consisting of H, $CH_3$ and an unbranched fatty acid residue containing from 8 to 18 carbon atoms in the carbon chain and hydrogenated derivatives thereof.

The fatty amine oxide has the formula

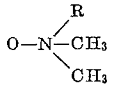

where R is an unbranched fatty acid residue containing from 8 to 18 carbon atoms in the carbon chain, e.g., lauryl, stearyl, coco and oleyl residues.

The fatty amine or fatty amine oxide when used provides good results if present in amounts ranging from 3 to 15 parts by weight in the additive composition, with best results being secured where from 8 to 12 parts by weight thereof are utilized.

The fatty amine is cationic in acid media, e.g., in the ferric chloride aqueous solution.

A specific example of a fatty amine is distilled octyl amine, commercially available from Armour Industrial Chemical Company as Armeen 8D.

Other satisfactory materials are dodecyl amine, hexadecyl amine, octadecyl amine, decyl amine, tallow amine, di-N-octyl amine, tri-N-octyl amine, dimethyl dodecyl amine, methyl dihydrogenated tallow amine, dicoco amine, dihydrogenated tallow amine and N-coco beta amino butyric acid.

A specific example of a fatty amine oxide is lauryl dimethyl amine oxide, commercially available from Onyx Chemical Corporation.

The alkyl sulfate ester is a fatty alcohol sulfate, to wit, a sulfate ester of a fatty alcohol, wherein the alkyl residue contains from 8 to 18 carbon atoms in the carbon chain. The ester preferably, but not necessarily is neutralized. The alkyl sulfate ester has the formula $RSO_4M$, where R is an alkyl or branched fatty acid residue, either saturated or unsaturated, containing from 8 to 18 carbon atoms in the carbon chain and M is a member of the group consisting of Na and triethanolamine.

The alkyl sulfate ester when used provides good results if present in amounts ranging from 1 to 35 parts by weight in the additive composition, with best results being secured where from 4 to 7 parts by weight thereof are utilized.

A specific example of an alkyl sulfate ester is triethanolamine lauryl sulfate.

Other satisfactory materials are sodium lauryl sulfate, sodium tridecyl sulfate, triethanolamine tridecyl sulfate, sodium 2-ethyl hexyl sulfate, sodium octyl sulfate, triethanolamine octyl sulfate, sodium undecyl sulfate, sodium tridecyl sulfate, and triethanolamine tridecyl sulfate.

The glycol ether is a compound selected from the group consisting of alkyl ethers of ethylene glycol, diethylene glycol and triethylene glycol, and 1-butoxyethoxy-2-propanol.

The alkyl ethers of ethylene glycol are marketed under the came of Cellosolves. These include, for example, methyl, ethyl, butyl, isobutyl and hexyl ethers of ethylene glycol.

The alkyl ethers of diethylene glycol are marketed under the name of Carbitols. These include, for example, methyl, ethyl, butyl and hexyl carbitols.

The alkyl ethers of triethylene glycol include, for example, methoxy, ethoxy and butoxy triglycols.

The glycol ether when used provides good results if present in amounts ranging from 5 to 50 parts by weight in the additive composition with best results being secured where from 8 to 12 parts by weight are utilized.

Specific examples of petroleum fractions found to be useful in the practice of our invention are:

| Name of Solvent | Specific Gravity at 60° F. | Distillation Characteristics | | | Flash Pt., ° F. TCC | KB cc. | Mixed Aniline Cloud Pt., ° F. |
|---|---|---|---|---|---|---|---|
| | | IBP, ° F. | 50%, ° F. | Dry End Pt., ° F. | | | |
| Amsco Toluene | 0.8708 | [1] 110.3 | [1] 110.6 | [1] 110.9 | ------------ | 105.0 | 49.5 |
| Amsco Xylene | 0.8708 | [1] 138.9 | [1] 139.4 | [1] 140.6 | ------------ | 99.5 | 51.5 |
| Amsco Hi-Flash Naphtha | 0.8692 | 312 | 328 | 361 | 108 | 87.5 | 65.0 |
| Amsco Solv. G | 0.8927 | 362 | 375 | 414 | 143 | 89.0 | 62.5 |
| Amsco-Solv. E-98 | 0.9718 | 398 | 441 | 493 | [2] 176 | +105 | 57.5 |
| Amsco-Solv. H-CC | 0.9646 | 496 | 560 | ---------- | [2] 240 | ------------ | 102.5 |
| Amsco-Solv. H-J | 0.9986 | 505 | 542 | ---------- | [2] 250 | ------------ | 56.0 |
| Amsco-Solv. H-SB | 0.9328 | 355 | 455 | 530 | 154 | +105 | 76.0 |

[1] Deg. C. [2] PMCC.

It will be observed that all of the solvents above listed are highly aromatic solvents. We also may use blends of any of these highly aromatic solvents with primarily aliphatic hydrocarbons although it is preferred that the aromatic portion constitute at least 80% of the water-immiscible organic liquid.

Typical aliphatic hydrocarbons which can be mixed with the aromatic solvents in the foregoing manner are:

| Name | API Gravity at 60° F. | Specific Gravity at 60° F. | Distillation Characteristics | | | Flash Pt. ° F. TCC | KB, cc. | Aniline Cloud Pt., ° F. |
|---|---|---|---|---|---|---|---|---|
| | | | IBP, ° F. | 50%, ° F. | Dry End Pt., ° F. | | | |
| Amsco Napthol Spirits | 53.5 | 0.7649 | 310 | 320 | 335 | 102 | 34.1 | 142.0 |
| Amsco Mineral Spirits | 48.6 | 0.7857 | 313 | 339 | 386 | 104 | 37.4 | 132.0 |
| Amsco Odorless Mineral Spirits | 54.5 | 0.7608 | 352 | 365 | 386 | 125 | 27.0 | 184.5 |
| Amsco 140 Solvent | 49.1 | 0.7835 | 364 | 374 | 399 | 142 | 32.3 | 150.0 |
| Amsco 460 Solvent | 41.5 | 0.8179 | 375 | 401 | 445 | 150 | 38.8 | 130.5 |
| Amsco Odorless 450 Solvent | 51.6 | 0.7728 | 400 | 420 | 457 | 165 | 24.8 | 194.0 |

All of the aliphatic hydrocarbons and the aromatic solvents listed above are sold by American Mineral Spirits Co.

The petroleum fraction provides good results if present in amounts ranging from 400 to 1000 parts by weight in the additive composition, the best results being secured where from 500 to 800 parts by weight thereof are utilized It is pertinent to observe that the parts by weight given for the six additional components are relative to the parts by weight for the water-immiscible liquid. That is to say, the parts by weight specified for the additional components are on the basis of from 400 to 1000 parts by weight of the water-immiscible liquid. This ratio is maintained when more or less of the water-immiscible liquid is employed. Thus, if an examplificative range of say 5 to 15 parts by weight is given for one additional component, it denotes that this range of parts by weight is employed with anywhere from 400 to 1000 parts by weight of the water-immiscible liquid. Hence, if the amount of water-immiscible liquid used is 100 parts by weight, there can be used with it from 0.5 to 3.75 parts by weight of said additional component.

The additive composition is prepared by mixing together, for example, by stirring, the additional components with the immiscible organic liquid. We have found that this can be effected with ease at room temperature in a comparatively short period, for example, about 5 minutes. It is to be understood, of course, that if desired, the mixing can be carried out at lower temperatures for more protracted periods of time or at higher temperatures. However, since satisfactory results are secured in such a short period of time at room temperatures, we do not consider it necessary to chill or heat the additive composition while its additional components are being intimately dispersed in the water-immiscible liquid.

The additive composition may be stored for protracted periods since there is no marked tendency for the additional components to settle in the water-immiscible liquid. However, should there with some particular proportion of additional components be noted a tendency to settle after a long standing period, the additional components can be readily dispersed by stirring or by agitating the additive composition.

To make an etching bath we mix together a major proportion of the ferric chloride water solution with a far lesser amount of the aforesaid additive composition. Very good results are secured where there is employed from 2.5 parts by volume to 7 parts by volume of the additive composition with 97.5 parts by volume to 93 parts by volume of the ferric chloride solution, the total being 100 parts by volume. The ferric chloride solution employed in the foregoing manner will have a sufficient amount of ferric chloride therein to obtain a range of from 25 to 48° Baumé. It will be appreciated that the ferric chloride solution can be initially introduced in the form of a high Baumé concentration and that water also can be introduced into the etching bath so as to obtain the desired degree of concentration of the ferric chloride.

A particularly satisfactory etching bath includes 66.85 parts by volume of a 42° Baumé ferric chloride aqueous solution, 3.85 parts by volume of an additive composition such as set forth in Example I below, and sufficient water to make up 100 parts by volume. The various parts of the etching bath are stirred together for a few minutes, e.g., 10 minutes, for example by the paddles of a conventional paddle-type etching machine.

EXAMPLE I

| | Parts by weight |
|---|---|
| Amsco-Solv. E 98 | 89 |
| Gafac RS 610 | 4.6 |
| Adogen 446 | 1.6 |
| Ethoduomeen T 25 | 1.3 |
| Armeen 8D | 1.3 |
| Triethanolamine lauryl sulfate | 0.9 |
| 1-butoxyethoxy-2-propanol | 1.3 |

After the etching composition was prepared by mixing the indicated amounts of the additive composition of Example I with the indicated amounts of the ferric chloride aqueous solution of specified strength, the etching composition was used to etch exposed portions of a copper printing plate parts of which were covered by a resist coating which was impervious to a ferric chloride etching solution. The ferric chloride etching bath was applied to the printing plate by a splashing method in which the plate was held horizontally above an etching bath and an 8" diameter rotor with cupped blades thereon was turned at 450 to 650 r.p.m., so that the blades dipped in the etching bath and then were lifted clear of the bath and threw the etching composition from successive blades on to the undersurface of the copper plate. Etching was performed at 85° to 95° F. The etching took place in the normal time, to wit, about 10 to 30 minutes. A very high etch factor in the order of 100 and a good shoulder angle in excess of 15° was obtained. There were no chips in the top or base of the etch.

The following are examples of other etching baths embodying our invention with which etched plates were made by the method outlined above. All of these baths secured improved protection, giving etch factors of at least 10. They did not have a tendency to chip at the sides or base of the etch. The shoulders of the etches were not undercut and the shoulder angles were at least 15°. No bath was as good as Example I. In each of these following examples the parts of the etching bath are given by volume, the parts of the additive composition are given by weight, the parts of the etching bath add up to 100 with the balance being water, the parts of the additive composition add up to 100, the additive composition is referred to by the logogram "AD," and the ferric chloride is an aqueous solution of 420 Baumé.

EXAMPLE II

Etching bath:

| | |
|---|---|
| $FeCl_3$ | 61.8 |
| AD | 2.28 |
| Balance water. | |

AD:

| | |
|---|---|
| Amsco 460 Solvent | 29.0 |
| Amsco-Solv. H–J | 50.7 |
| Adogen 466 | 20.3 |

EXAMPLES III–VII

| | Etching Bath | | | | |
|---|---|---|---|---|---|
| | III | IV | V | VI | VII |
| $FeCl^3$ | 54.87 | 53.19 | 56.84 | 55.66 | 53.66 |
| AD | 11.77 | 14.89 | 9.47 | 15.00 | 13.72 |
| Balance water. | | | | | |

| | AD | | | | |
|---|---|---|---|---|---|
| | III | IV | V | VI | VII |
| Amsco 460 Solvent | 49.8 | 38.0 | 39.6 | 57.5 | 12.9 |
| Amsco-Sov. H–J | 40.7 | 54.2 | 48.4 | 35.2 | 78.8 |
| Adogen 446 | 3.3 | 1.6 | 6.0 | 3.5 | 3.2 |
| Sodium 2-ethyl hexyl sulfate | 2.0 | 1.9 | 3.6 | 2.4 | 2.7 |
| 1-butoxy ethoxy-2-propanol | 4.2 | 4.3 | 2.4 | 1.4 | 2.4 |

EXAMPLE VIII

Etching bath:

| | |
|---|---|
| $FeCl_3$ | 54.35 |
| AD | 12.62 |
| Balance water. | |

AD:

| | |
|---|---|
| Amsco-Solv. G. | 39.4 |
| Amsco-Solv. H–J | 53.1 |
| Adogen 446 | 2.7 |
| Sodium 2-ethyl hexyl sulfate | 2.1 |
| 1-butoxyethoxy-2-propanol | 2.7 |

EXAMPLE IX

Etching bath:

| | |
|---|---|
| $FeCl_3$ | 53.58 |
| AD | 13.85 |
| Balance water. | |

AD:

| | |
|---|---|
| Amsco-Solv. H–J | 91.1 |
| Adogen 446 | 3.5 |
| Sodium 2-ethyl hexyl sulfate | 2.7 |
| 1-butoxyethoxy-2-propanol | 2.7 |

EXAMPLE X

Etching bath:

| | |
|---|---|
| $FeCl_3$ | 53.63 |
| AD | 13.77 |
| Balance water. | |

AD:

| | |
|---|---|
| Amsco 460 Solvent | 6.4 |
| Amsco-Solv. H–J | 62.4 |
| Amsco-Solv. HCC | 22.6 |
| Adogen 446 | 3.6 |
| Sodium 2-ethyl hexyl sulfate | 2.7 |
| 1-butoxyethoxy-2-propanol | 2.3 |

EXAMPLE XI

Etching bath:

| | |
|---|---|
| $FeCl_3$ | 53.71 |
| AD | 13.65 |
| Balance water. | |

AD:

| | |
|---|---|
| Amsco 460 Solvent | 42.0 |
| Amsco-Solv. HCC | 49.7 |
| Adogen 446 | 2.6 |
| Lauryl dimethyl amine oxide | 0.9 |
| Sodium 2-ethyl hexyl sulfate | 2.4 |
| 1-butoxyethoxy-2-propanol | 2.4 |

EXAMPLE XII

Etching bath:

| | |
|---|---|
| $FeCl_3$ | 53.61 |
| AD | 13.74 |
| Balance water. | |

AD:

| | |
|---|---|
| Amsco-Solv. E–98 | 91.6 |
| Adogen 446 | 3.2 |
| Lauryl dimethyl amine oxide | 0.6 |
| Sodium 2-ethyl hexyl sulfate | 2.7 |
| 1-butoxyethoxy-2-propanol | 1.9 |

EXAMPLE XIII

Etching bath:

| | |
|---|---|
| $FeCl_3$ | 57.64 |
| AD | 7.78 |
| Balance water. | |

AD:

| | |
|---|---|
| Amsco-Solv. E–98 | 80.4 |
| Adogen 446 | 5.5 |
| Lauryl dimethyl amine oxide | 1.1 |
| Sodium 2-ethyl hexyl sulfate | 4.7 |
| 1-butoxyethoxy-2-propanol | 3.3 |
| Hexyl Cellosolve | 5.0 |

EXAMPLE XIV

Etching bath:

| | |
|---|---|
| $FeCl_3$ | 55.61 |
| AD | 13.49 |
| Balance water. | |

AD:

| | |
|---|---|
| Amsco-Solv. E–98 | 45.1 |
| Amsco-Solv. H–J | 46.3 |
| Adogen 446 | 3.9 |
| Lauryl dimethyl amine oxide | 0.3 |
| Sodium 2-ethyl hexyl sulfate | 2.5 |
| 1-butoxyethoxy-2-propanol | 1.9 |

EXAMPLE XV

Etching bath:

| | |
|---|---|
| $FeCl_3$ | 66.98 |
| AD | 2.50 |
| Balance water. | |

AD:

| | |
|---|---|
| Amsco-Solv. E–98 | 90.1 |
| Gafac RS–610 | 1.6 |
| Ethoduomeen T 13 | 1.2 |
| Ethoduomeen T 25 | 0.9 |
| Armeen 8D | 1.6 |
| 1-butoxyethoxy-2-propanol | 4.6 |

EXAMPLE XVI

Etching bath:

| | |
|---|---|
| $FeCl_3$ | 67.37 |
| AD | 2.54 |
| Balance water. | |

AD:

| | |
|---|---|
| Amsco-Solv. E–98 | 88.8 |
| Gafac RS–610 | 2.0 |
| Alkapent M 60 | 0.7 |
| Ethoduomeen T 25 | 2.3 |
| Armeen 8D | 1.6 |
| 1-butoxyethoxy-2-propanol | 4.6 |

EXAMPLES XVII–XXIV

| | Etching Bath | | | | | | | |
|---|---|---|---|---|---|---|---|---|
| | XVII | XVIII | XIX | XX | XXI | XXII | XXIII | XXIV |
| $FeCl_3$ | 66.95 | 63.18 | 62.74 | 62.78 | 62.78 | 62.78 | 62.74 | 67.27 |
| AD | 2.53 | 3.13 | 3.78 | 3.72 | 3.74 | 3.76 | 3.81 | 1.90 |
| Balance water. | | | | | | | | |

| | AD | | | | | | | |
|---|---|---|---|---|---|---|---|---|
| | XVII | XVIII | XIX | XX | XXI | XXII | XXIII | XXIV |
| Amsco-Solv. E98 | 89.0 | 89.3 | 88.2 | 89.7 | 89.1 | 88.8 | 87.6 | 88.3 |
| Gafac RS–610 | 2.0 | 2.2 | 2.9 | 2.8 | 3.5 | 4.3 | 5.3 | 2.1 |
| Adogen 446 | 1.4 | 1.7 | 2.7 | 1.8 | 2.0 | 1.8 | 2.1 | 0.9 |
| Ethoduomeen T 25 | 1.6 | 2.0 | 2.1 | 1.5 | 1.7 | 2.0 | 2.0 | 2.1 |
| Armeen 8D | 1.6 | 1.5 | 1.4 | 1.4 | 1.4 | 1.4 | 1.5 | 2.1 |
| 1-butoxy-ethoxy-2-propanol | 4.4 | 3.3 | 2.7 | 2.8 | 2.3 | 1.7 | 1.5 | 4.5 |

EXAMPLE XXV

Etching bath:

| | |
|---|---|
| $FeCl_3$ | 63.11 |
| AD | 3.76 |
| Balance water. | |

AD:

| | |
|---|---|
| Amsco-Solv. E–98 | 90.0 |
| Adogen 446 | 0.8 |
| N-coco beta amino butyric acid | 0.8 |
| Sodium 2-ethyl hexyl sulfate | 6.1 |
| 1-butoxyethoxy-2-propanol | 2.3 |

EXAMPLE XXVI

Etching bath:

| | |
|---|---|
| $FeCl_3$ | 67.72 |
| AD | 3.26 |
| Balance water. | |

AD:

| | |
|---|---|
| Amsco-Solv. E–98 | 86.9 |
| Adogen 446 | 1.4 |
| N-coco beta amino butyric acid | 1.8 |
| Sodium 2-ethyl hexyl sulfate | 7.2 |
| 1-butoxyethoxy-2-propanol | 2.7 |

EXAMPLE XXVII

Etching bath:

| | |
|---|---|
| $FeCl_3$ | 67.21 |
| AD | 1.98 |
| Balance water. | |

AD:

| | |
|---|---|
| Amsco-Solv. E–98 | 84.2 |
| Gafac RS–610 | 2.9 |
| Ethoduomeen T 20 | 2.0 |
| Armeen 8D | 2.3 |
| 1-butoxyethoxy-2-propanol | 8.6 |

EXAMPLE XXVIII

Etching bath:

| | |
|---|---|
| $FeCl_3$ | 67.63 |
| AD | 1.37 |
| Balance water. | |

AD:

| | |
|---|---|
| Amsco-Solv. E–98 | 81.8 |
| Gafac RE 610 | 4.2 |
| Ethoduomeen T 20 | 3.0 |
| Armeen 8D | 3.0 |
| 1-butoxyethoxy-2-propanol | 8.0 |

EXAMPLE XXIX

Etching bath:

| | |
|---|---|
| $FeCl_3$ | 66.96 |
| AD | 2.53 |
| Balance water. | |

AD:

| | |
|---|---|
| Amsco-Solv. 98 | 89.2 |
| Gafac RS 610 | 2.1 |
| Adogen 446 | 0.9 |
| Ethoduomeen T 20 | 0.9 |
| Armeen 8D | 2.1 |
| 1-butoxyethoxy-2-propanol | 4.8 |

EXAMPLES XXX–XXXII

| | Etching Bath | | |
|---|---|---|---|
| | XXX | XXXI | XXXII |
| $FeCl_3$ | 66.67 | 66.67 | 66.67 |
| AD | 4.10 | 4.10 | 4.10 |
| Balance water. | | | |

| | AD | | |
|---|---|---|---|
| | XXX | XXXI | XXXII |
| Amsco-Solv. E 98 | 88.5 | 90.0 | 89.8 |
| Gafac RS 610 | 5.0 | 4.8 | 4.8 |
| Adogen 446 | 1.6 | 1.3 | 1.3 |
| Ethoduomeen T 20 | 0.4 | 0.3 | 0.3 |
| Ethoduomeen T 25 | 0.9 | 1.2 | 1.2 |
| Armeen 8D | 1.3 | 1.3 | 1.3 |
| Triethanolamine lauryl sulfate | 0.7 | ------- | ------- |
| 1-butoxyethoxy-2-propanol | 1.6 | 1.1 | 1.3 |

EXAMPLE XXXIII

Etching bath:

| | |
|---|---|
| $FeCl_3$ | 68.81 |
| AD | 6.56 |
| Balance water. | |

AD:

| | |
|---|---|
| Amsco-Solv. E 98 | 86.0 |
| Adogen 446 | 4.0 |
| Trimethyl soya quaternary amine | 1.3 |
| Trimethyl stearyl quaternary amine | 1.8 |
| Sodium 2-ethyl hexyl sulfate | 3.4 |
| 1-butoxyethoxy-2-propanol | 3.5 |

EXAMPLE XXXIV

Etching bath:

| | |
|---|---|
| $FeCl_3$ | 59.47 |
| AD | 6.31 |
| Balance water. | |

AD:

| | |
|---|---|
| Amsco-Solv. E 98 | 88.4 |
| Adogen 446 | 2.3 |
| Trimethyl soya quaternary amine | 0.5 |
| Ethoduomeen T 20 | 0.5 |
| Armeen 8D | 0.5 |
| Sodium 2-ethyl hexyl sulfate | 4.6 |
| 1-butoxyethoxy-2-propanol | 3.2 |

Our novel etching composition and method is not restricted to use only in the splash method of application of the etching solution to the object to be etched. The same will function satisfactorily with the spray method which is well known to the art.

It thus will be sen that we have provided a method and composition for etching copper and copper-containing alloys which accomplish the various objects of our invention and are well adapted to meet the conditions of practical use.

As various possible embodiments might be made of the above invention and as changes might be made in the embodiments set forth, it is to be understood that all matter herein described is to be interpreted as illustrative and not in a limiting sense.

Having thus described our invention, we claim as new and desire to secure by Letters Patent:

1. An etching bath for etching a surface of objects of copper and copper-containing alloys having uncoated areas and resist coated areas, said etching bath comprising a two-phase dispersion of a ferric chloride aqueous solution, and an additive composition of a mixture of a petroleum fraction and a system of additional components, the ferric chloride aqueous solution constituting from 97.5 to 93 parts by volume of the bath and having a specific gravity of from 25° to 48° Baumé, the additive composition constituting from 2.5 to 7 parts by volume of the bath, the petroleum fraction having a boiling point of from about 90° to 390° C., the petroleum fraction constituting from 80 to 95% by weight of the additive composition and the additional components constituting from 20 to 5% by weight of the additive composition, said additional components being selected from the group consisting of (a) 15 to 50 parts by weight of an ester of orthophosphoric acid and a compound selected from the group consisting of ethoxylated aliphatic alcohols and ethoxylated phenols having the formula

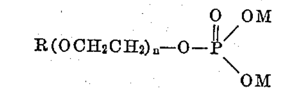

for the mono-phosphate ester, and the formula

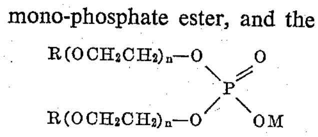

for the di-phosphate ester, where R is a member selected from the group consisting of alkyl phenol residues and aliphatic alcohol residues in which the non-aromatic portions have from 8 to 24 carbon atoms, M is a member selected from the group consisting of H, Na, K and $NH_3$, and *n* is an integer from 1 to 20, (b) 5 to 25 parts by weight of an alkyl quaternary fatty amine having the formula

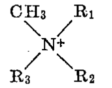

where $R_1$ is a member selected from the group consisting of long chain fatty acid residues and hydrogenated derivatives thereof having from 8 to 18 carbon atoms in the carbon chain, $R_2$ is a member selected from the group consisting of $CH_3$, furfuryl and long chain fatty acid residues and hydrogenated derivatives thereof having from 8 to 18 carbon atoms in the carbon chain, and $R_3$ is a member selected from the group consisting of $CH_3$ and long chain fatty acid residues and hydrogenated derivates thereof having from 8 to 18 carbon atoms in the carbon chain.

(c) 5 to 15 parts by weight of a polyethoxylated amine selected from the group consisting of mono-amines having the formula

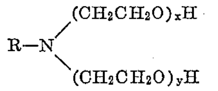

and diamines having the formula

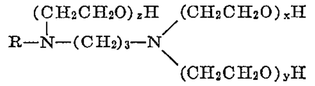

where $x+y$ for the mono-amine is an integer ranging from 2 to 50, $x+y+z$ for the diamine is an integer ranging from 3 to 80 and R is a long chain fatty acid residue having from 8 to 18 carbon atoms in the carbon chain, (d) 3 to 15 parts by weight of an amine selected from the group consisting of fatty amines having the formula

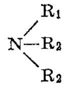

where $R_1$ is a member selected from the group consisting of butyric acid and unbranched fatty acid residues and hydrogenated derivatives thereof having from 8 to 18 carbon atoms in the carbon chain and $R_2$ is a member selected from the group consisting of H, $CH_3$ and unbranched fatty acid residues and hydrogenated derivatives thereof having from 8 to 18 carbon atoms in the carbon chain, and fatty amine oxides having the formula

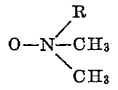

where R is an unbranched fatty acid residue containing from 8 to 18 carbon atoms in the carbon chain, (e) 1 to 35 parts by weight of an alkyl sulfate ester having the formula $RSO_4M$ where R is a member of the group consisting of alkyl and branched fatty acid residues containing from 8 to 18 carbon atoms in the carbon chain and M is a member of the group consisting of Na and triethanolamine, and (f) 5 to 50 parts by weight of a glycol ether selected from the group consisting of alkyl ethers of ethylene glycol, diethylene glycol and triethylene glycol where the alkyl fraction has from 1 to 6 carbon atoms, and 1-butoxyethoxy-2-propanol.

2. An ething bath as set forth in claim 1 wherein the additional components are: a mixture of the free acid forms of mono- and di-phosphate esters of ethoxylated tridecyl alcohol having a 60% to 70% ethoxylation, dimethyl alkyl furfuryl quaternary amine, ethylene oxide condensation products of N-tallow trimethylene diamine wherein in the formula

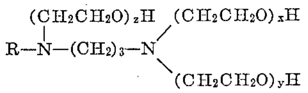

$x+y+z$ is 15, distilled octyl amine, triethanolamine lauryl sulfate and 1-butoxyethoxy-2-propanol.

3. An etching bath as set forth in claim 1 wherein the additional components are: a mixture of the free acid forms of mono- and di-phosphate esters of ethoxylated tridecyl alcohol having a 60% to 70% ethoxylation, dimethyl alkyl furfuryl quaternary amine, ethylene oxide condensation productss of N-tallow trimethylene diamine wherein in the formula

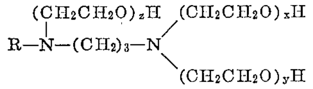

$x+y+z$ is 15, ethylene oxide condensation products of N-tallow trimethylene diamine wherein in the formula

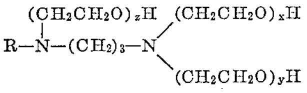

$x+y+z$ is 10, distilled octyl amine, triethanolamine lauryl sulfate and 1-butoxyethoxy-2-propanol.

4. An etching bath as set forth in claim 1 wherein the additional components are: a mixture of the free acid forms of mono- and di-phosphate esters of ethoxylated tridecyl alcohol having a 60% to 70% ethoxylation, dimethyl alkyl furfuryl quaternary amine, ethylene oxide condensation products of N-tallow trimethylene diamine wherein in the formula

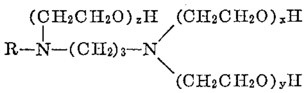

$x+y+z$ is 15, distilled octyl amine and 1-butoxyethoxy-2-propanol.

5. An etching bath as set forth in claim 1 wherein the additional components are: a mixture of the free acid forms of mono- and di-phosphate esters of ethoxylated tridecyl alcohol having a 60% to 70% ethoxylation, dimethyl alkyl furfuryl quaternary amine, ethylene oxide condensation products of N-tallow trimethylene diamine wherein in the formula

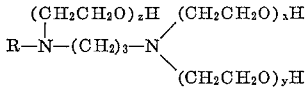

$x+y+z$ is 10, distilled octyl amine and 1-butoxyethoxy-2-propanol.

6. An etching bath as set forth in claim 1 wherein the additional components are: dimethyl alkyl furfuryl quaternary amine, trimethyl soya quaternary amine, ethylene oxide condensation products of N-tallow trimethylene diamine wherein in the formula

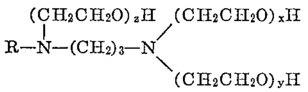

$x+y+z$ is 10, distilled octyl amine, sodium 2-ethyl hexyl sulfate and 1-butoxyethoxy-2-propanol.

7. An etching bath as set forth in claim 1 wherein the additional components are: a mixture of the free acid forms of mono- and di-phosphate esters of ethoxylated tridecyl alcohol having a 60% to 70% ethoxylation, ethylene oxide condensation products of N-tallow trimethylene diamine wherein in the formula
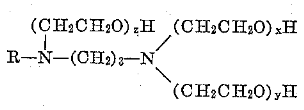
$x+y+z$ is 10, distilled octyl amine and 1-butoxyethoxy-2-propanol.
References Cited
UNITED STATES PATENTS
| | | | |
|---|---|---|---|
| 3,083,793 | 5/1962 | Bradley et al. | 156—14 |
| 3,161,552 | 12/1964 | Bradley et al. | 156—14 |
| 3,232,884 | 1/1966 | Lemaire | 252—79.4 |
| 3,251,777 | 5/1966 | Easley | 156—14 |
JACOB H. STEINBERG, *Primary Examiner.*